United States Patent
Zhang et al.

(10) Patent No.: US 8,102,197 B1
(45) Date of Patent: Jan. 24, 2012

(54) DIGITAL PHASE LOCKED LOOP

(75) Inventors: Weicheng Zhang, Shanghai (CN); Ming Shi, Shanghai (CN); Wei-Hua Zou, Shanghai (CN); Shu-Sun Yu, Cupertino, CA (US); Chieh-Yuan Chao, Fremont, CA (US)

(73) Assignee: Amlogic Co., Ltd., Santa Clara, CA (US)

( * ) Notice: Subject to any disclaimer, the term of this patent is extended or adjusted under 35 U.S.C. 154(b) by 0 days.

(21) Appl. No.: 12/914,956

(22) Filed: Oct. 28, 2010

Related U.S. Application Data

(63) Continuation of application No. 12/835,689, filed on Jul. 13, 2010, now Pat. No. 8,081,013.

(51) Int. Cl.
    *H03L 7/06* (2006.01)
(52) U.S. Cl. .................................. 327/156; 327/147
(58) Field of Classification Search .................. 327/147, 327/156
    See application file for complete search history.

(56) References Cited

U.S. PATENT DOCUMENTS

| | | | | |
|---|---|---|---|---|
| 6,064,273 A * | 5/2000 | Donohue | | 331/17 |
| 6,791,420 B2 * | 9/2004 | Unterricker | | 331/1 A |
| 6,831,491 B2 * | 12/2004 | Karlquist | | 327/156 |
| 2004/0119514 A1 * | 6/2004 | Karlquist | | 327/158 |
| 2006/0206603 A1 * | 9/2006 | Rajan et al. | | 709/223 |
| 2007/0249293 A1 * | 10/2007 | Chae et al. | | 455/76 |
| 2010/0049993 A1 * | 2/2010 | Okaue et al. | | 713/193 |
| 2010/0211740 A1 * | 8/2010 | Rajan et al. | | 711/114 |

* cited by examiner

*Primary Examiner* — Lincoln Donovan
*Assistant Examiner* — Adam Houston
(74) *Attorney, Agent, or Firm* — Venture Pacific Law, PC

(57) ABSTRACT

An adaptive digital phase locked loop comprises: a digital configurable phase detector for receiving a reference signal and a feedback signal and for generating a detection signal indicative of a phase/frequency difference between the reference signal and the feedback signal; a configurable digital loop filter for filtering the DPFD detection signal; a digital locking monitor for monitoring polarity transitions of the detection signal and adaptively switching the locking modes and DCO tuning resolution; and a DCO for generating the feedback signal as a function of the detection signal.

20 Claims, 13 Drawing Sheets

DIGITAL PHASE LOCKED LOOP

CROSS REFERENCE

This application claims priority from a non-provisional patent application entitled "A Digital Phase and Frequency Detector" filed on Jul. 13, 2010 and having an application Ser. No. 12/835,689. Said application is incorporated herein by reference.

FIELD OF INVENTION

This invention relates to a digital phase locked loop, and, in particular, to an all digital phase locked loop having multiple locking modes.

BACKGROUND

A phase-locked loop ("PLL") is a feed-back control system that generates an output signal whose phase is related to the phase of the input reference signal. A conventional or analog PLL includes a charge-pump based phase and frequency detector ("PFD"), a passive component based loop filter (e.g., resistors and capacitors), a voltage controlled-oscillator ("VCO") and a frequency divider. Typically, all of these devices, except the frequency divider, are implemented by analog methods.

Analog design approaches become more and more problematic as the physical size of circuits are reduced due to new integrated circuit ("IC") processing techniques. However, all digital phase locked loops ("ADPLLs") have shown great advantages in design and implementation methods for PLLs in deep submicron IC processing. Additionally, ADPLLs yield better testability, programmability, stability, and portability than traditional analog PLLs. As a result, the adoption of ADPLLs is a new trend in frequency synthesizers and clock generator designs.

Generally, there are two types of ADPLLs. One type of ADPLLs is based on a time-to-digital converter ("TDC") locking method and the other is based on a bang-bang ("B-B") locking method. The TDC based ADPLLs have relatively high performance and can be analyzed by a linear model. A drawback of the TDC based ADPLLs is that it is very hard to design a TDC which has fine resolution, wide measuring range, and good linearity. The B-B based ADPLLs eliminate the use of a TDC and have relatively simple structure. However, it is not without drawbacks since B-B based ADPLLs cannot be analyzed by a linear model and are not suitable for fractional-N PLL architectures.

Therefore, it is desirable to provide new methods and apparatuses for ADPLLs, which can combine a TDC locking method and a B-B locking method, while having the flexibility to vary the parameters for the resolution and the measuring range of the ADPLL.

SUMMARY OF INVENTION

An object of this invention is to provide an ADPLL having multiple locking modes, including one or more locking modes that are TDC based and one or more locking modes that are B-B based.

Another object of this invention is to provide an ADPLL having multiple locking modes, where a locking monitor adaptively switches the locking modes.

Yet another object of this invention is to provide an ADPLL, where the parameters for the components of the ADPLL are adaptively configured according to a locking mode.

Briefly, the present invention relates to a phase locked loop, comprising: a digital phase detector ("DPD") for receiving a reference signal and a feedback signal and for generating a detection signal indicative of a phase difference between the reference signal and the feedback signal and is a function of a selected locking mode; a locking monitor for monitoring polarity transitions of the detection signal, wherein the selected locking mode is selected from a plurality of locking modes as a function of the monitored polarity transitions; and an oscillator for generating the feedback signal as a function of the detection signal.

An advantage of this invention is that an ADPLL having multiple locking modes is provided, where one or more locking modes are TDC based and one or more locking modes are B-B based.

Another advantage of this invention is that an ADPLL having multiple locking modes is provided, where a locking monitor adaptively switches the locking modes.

Yet another advantage of this invention is that an ADPLL is provided, where the parameters for the components of the ADPLL are adaptively configured according to a locking mode.

DESCRIPTION OF THE DRAWINGS

The foregoing and other objects, aspects, and advantages of the invention will be better understood from the following detailed description of the preferred embodiment of the invention when taken in conjunction with the accompanying drawings in which.

DETAILED DESCRIPTION OF THE PREFERRED EMBODIMENTS

An all digital phase locked loop ("ADPLL") of the present invention can have two locking configuration types, including a non-linear based configuration type (e.g., a B-B based configuration type) and a linear based configuration type (e.g., a TDC based configuration type), and multiple locking modes.

The locking modes can be switched adaptively during the locking process. The ADPLL's frequency locking process can be divided into several locking modes (i.e., operating levels for the ADPLL), where the locking modes may use different configuration types and/or parameters for the components of the ADPLL. Furthermore, the locking modes can be switched adaptively during the locking process from a first one to a later one. For instance, in an initial state for target frequency tuning, the ADPLL can be configured in a B-B based configuration type for coarse frequency tracking. When the coarse frequency tracking process has reached a locking state, the ADPLL can be configured in a TDC based type for fine frequency locking. Other intermediate locking modes may also be present. According to each locking mode, the parameters for the components of the ADPLL can be adjusted.

In order to aid in the understanding of the invention, the following examples of the present invention may use a B-B locking method as an example of a non-linear locking method and a TDC locking method as an example of a linear locking method. However, it is understood that other theories for a non-linear locking method and for a linear locking method can be used in the alternative or in conjunction with the locking modes described herein.

Figure 1:
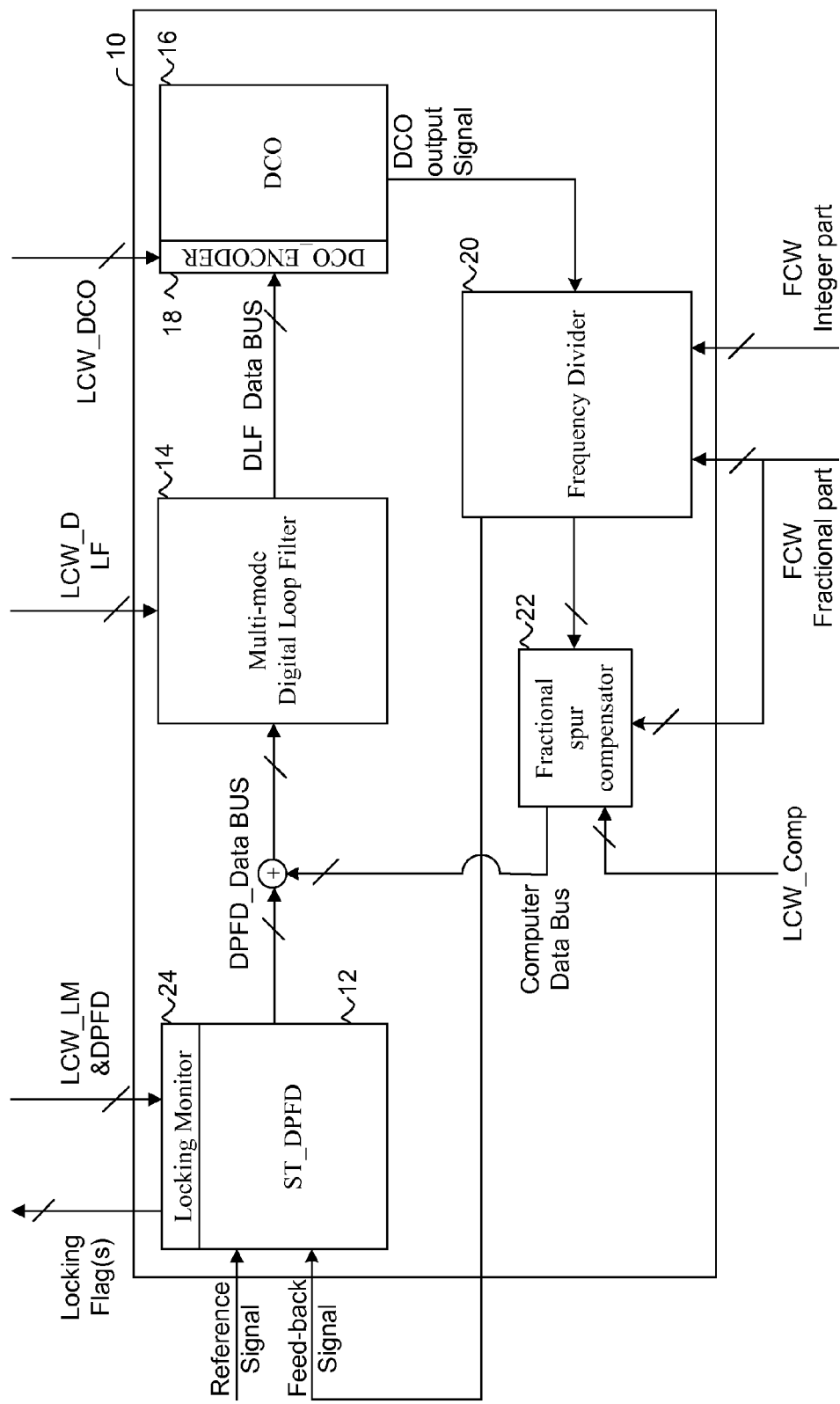
FIG. 1 illustrates a global architecture for an ADPLL of the present invention.

FIG. 1 illustrates a global architecture of an ADPLL of the present invention. The function blocks of an ADPLL 10 of the present invention includes a saturation transferred digital phase/frequency detector ("ST-DPFD") 12 for generating a detection signal indicative of a phase difference between an inputted reference signal and an inputted feed back signal, a multi-mode digital loop filter ("MM-DLF") 14 for filtering the noise contained by the output of the ST-DPFD 12, a digital controlled oscillator ("DCO") 16 with a DCO encoder 18 for generating a DCO output signal, a frequency divider 20 for dividing the output signal to generate the feedback signal, a digital frequency compensator 22 for compensating fractional-spurs, a loop controller (not shown) for transmitting the control signals, e.g., LCW_LM&DPFD signal, LCW_DLF signal, and LCW_DCO signal, to the components of the ADPLL 10, and a digital locking monitor 24 for generating locking flags to adaptively control the ADPLL system. The detection signal can be generated according to a B-B locking method or a TDC locking method.

The components of the ADPLL of the present invention are digitally configurable. Specifically, the ADPLL system can be configured using one or more digital words (other methods known in the art can also be used to configure the ADPLL system). The operating parameters (such as the configuration type, bandwidth, and DCO resolution) of the ADPLL can be defined by a digital control word, herein referred to as the Loop Control Word ("LCW"), which is set by preprogrammed software commands. Another important digital word is the Frequency Control Word ("FCW"). The output frequency of the ADPLL is determined by $$f_{out} = FCW \cdot f_{ref} \quad (1)$$

Generally, the FCW is an inputted number to the frequency divider 20. The output frequency is determined by the multiplication of the FCW and the reference frequency.

The LCW_LM&DPFD signal, LCW_DLF signal, and LCW_DCO signal, and LCW_comp signal are parts of the LCW, where each of the control signals control different components of the ADPLL 10.

The FCW_Frac signal and FCW_Int signal are two parts of the FCW, where the FCW_Frac represents the fractional part of the FCW and the FCW_Int represents the integer part of the FCW. For example, if the FCW is 60.223, then the FCW_Int is 60 and the FCW_Frac is 0.223. The output frequency is then determined by the FCW multiplied with the reference frequency. The fractional part of the FCW can't be directly obtained from the divider, thus a sigma-delta modulator can be used to obtain an average frequency, which is close to the target.

There can be at least two locking modes during the locking process of the ADPLL. During the startup of a locking process, the ADPLL can first enter locking mode 1 using a B-B configuration type. As the output frequency or clock gets closer to the target frequency, the locking detector monitors the locking process and generates locking flags. The generation of the locking flags can be dependent on a pre-defined monitor time, a threshold number, and/or a number of detected polarity transitions in the predefined monitor time. The locking flags indicate when the threshold values are met. Once a locking flag is generated, the next locking mode is engaged. Once the locking mode is selected, a loop controller can set the system configuration type and parameters of the system according to the selected locking mode.

Thus, the ADPLL system can automatically switch to different locking modes to increase locking accuracy and increase locking speed of the output signal to the target frequency. Once the ADPLL has reached a near steady state, then locking mode using a TDC configuration type with a proper bandwidth can be engaged.

Figure 2:
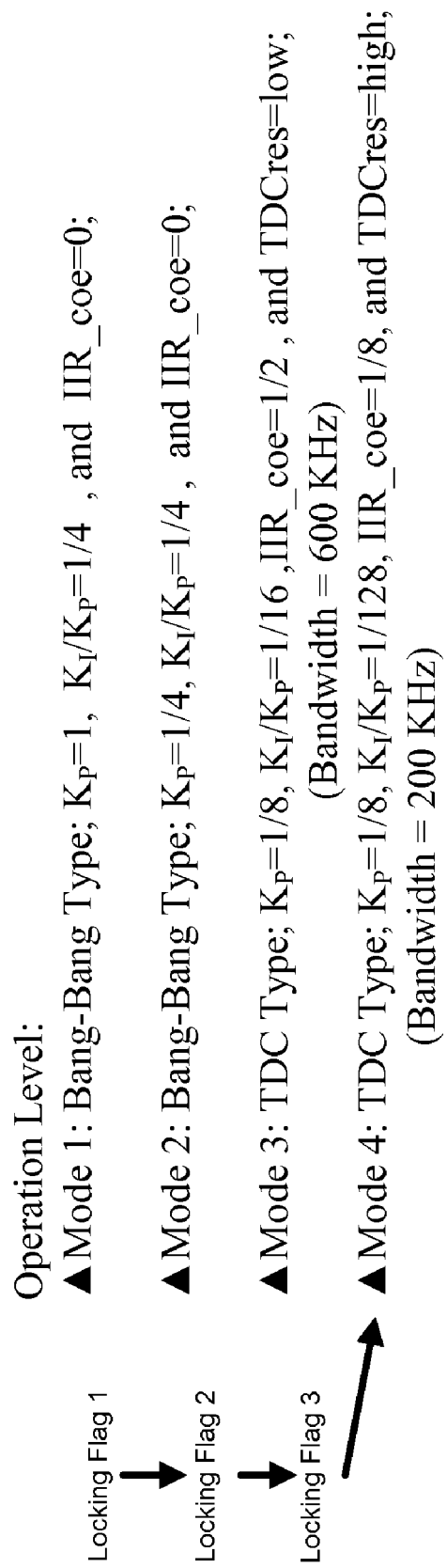
FIG. 2 illustrates a flow diagram for a locking process of an ADPLL of the present invention.

FIG. 2 illustrates an example of the locking process of the ADPLL of the present invention. In an initial locking mode 1, the ADPLL is operated using a B-B locking method. The loop parameters for locking mode 1 are set to the proportional path gain $K_P=1$, the ratio of the integer path gain to proportional path gain $K_I/K_P=1/4$, and the IIR coefficient is IIR_coe=0. Once locking flag 1 is generated (indicating that the corresponding threshold value is met), locking mode 2 is engaged. Locking mode 2 is operated using a B-B locking method and the loop parameters are set to $K_P=1/4$, $K_I/K_P=1/4$, and the IIR coefficient is IIR_coe=0.

As the locking process proceeds, another threshold value may be met, triggering locking mode 3. However, under locking mode 3, the ADPLL is operated using a TDC configuration type. The loop parameters for mode 3 are $K_P=1/8$, $K_I/K_P=1/16$, IIR_coe=1/2, and $TDC_{res}$=low. Here, the bandwidth is equal to around 600 KHz. As the locking process proceeds further, yet another threshold value may be met, triggering locking mode 4. Under locking mode 4, the ADPLL is operated using a TDC configuration type, where the loop parameters can be set to $K_P=1/8$, $K_I/K_P=1/128$, IIR_coe=1/8, and $TDC_{res}$=high. Here, the bandwidth is equal to around 200 KHz.

It is understood that the above mentioned example illustrates a locking process of an ADPLL of the present invention, but is not meant to restrict the present invention to this particular locking process. In fact, any number of locking modes can be used and various loop parameters can also be set for each locking mode. Furthermore, the locking modes may start with any locking method, including a TDC locking method or a B-B locking method. For instance, instead of the initial locking mode using a B-B locking method, the initial locking mode can use a TDC locking method may be engaged for the ADPLL.

The Locking Monitor and Loop Controller

The locking modes can be switched adaptively according to the configuration of the locking monitor. The locking monitor generates locking flags to indicate when a next locking mode should be initiated and monitors the polarity transitions for the output of the ST-DPFD. When a digital PLL is close to a locking state, the polarity of the phase error at input of the PFD will hop between positive and negative. The polarity changes can be sensed in non-linear locking methods for digital PLLs (e.g., a B-B locking method) and also in linear locking methods for digital PLLs (e.g., a TDC locking method).

The information of the polarity transitions of the phase error can be digitalized to a one bit polarity signal. By using this digital signal, a locking detector (also referred to as a locking monitor) can generate locking flags to indicate when a threshold value is met. When the threshold value is met, then a next locking mode is engaged. The system parameters for the ADPLL can also be set according to the locking mode and/or operating level which is engaged.

Figure 3:
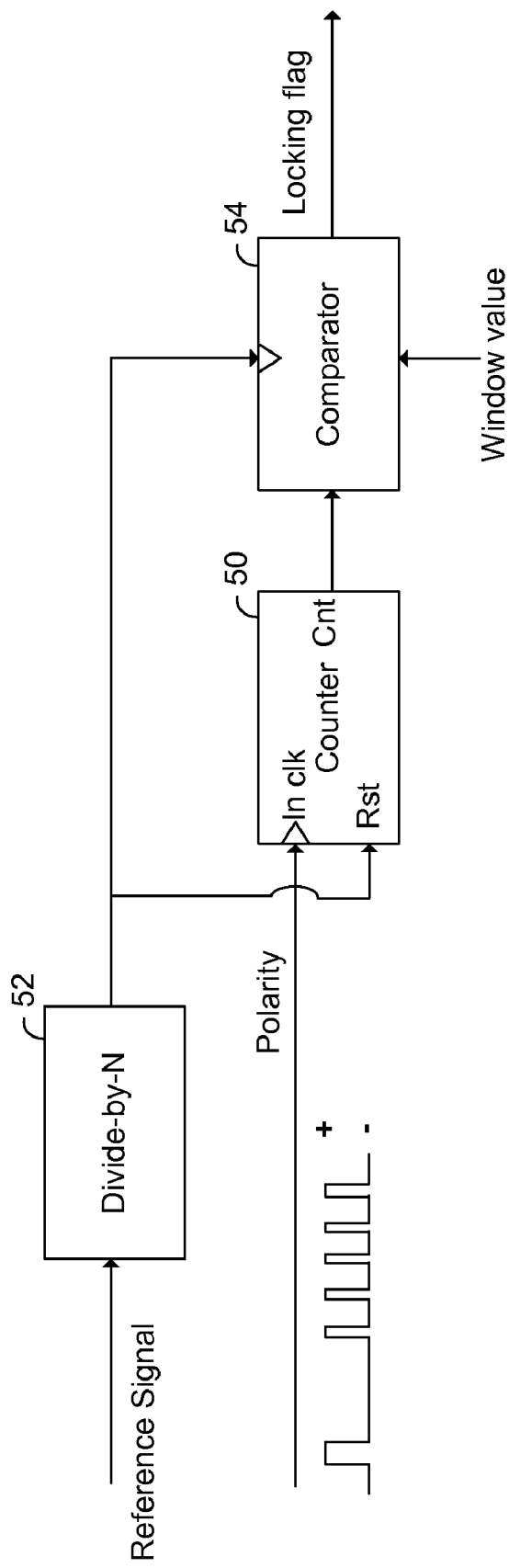
FIG. 3 illustrates a block diagram for a locking detector of an ADPLL of the present invention.

FIG. 3 illustrates a block diagram of a locking detector for an ADPLL of the present invention. A cyclic reset counter 50 counts the number of polarity transitions during a predefined amount of time. A divide-by-N circuit block 52 can generate a clock signal based on the reference signal divided by a preset number N. A comparator 54 compares the counted number of polarity transitions with a preset threshold value, which can be also referred to as a window value. If the counted number of polarity transitions is greater than or equal to the preset threshold value, a locking flag is generated. The locking flag can be a one bit signal, where a low signal (e.g., 0) can indicate the locking flag is not engaged and a high signal (e.g., 1) can indicate the locking flag is engaged. Other methods for implementing a locking flag can also be used.

The locking flag generated by the locking detector can be transmitted to the ST-DPFD to switch to a next locking mode. The locking flag can also be transmitted to the other components of the ADPLL to configure the components according to the next locking mode.

Note the locking detector is an example of a block circuit that can monitor polarity transitions and compare the number of polarity transitions against a threshold value. It is understood that the present invention claims to any and all other circuits which are able to monitor polarity transitions and compare the number of polarity transitions in a predefined amount of time with a threshold value.

Limited by the finite resolution of the DPFD and the DCO, the locking accuracy of an ADPLL varies according to its configuration. The present invention can have multiple locking modes to set the resolution for the DPFD and the DCO via the loop control word, LCW. The earlier locking modes in the locking process can configure the ADPLL to have fast-locking (or wide bandwidth) capability, but low locking accuracy. The later locking modes in the locking process can configure the ADPLL to have a fine locking accuracy, but low locking speed. All of the operating levels can be switched adaptively by a locking monitor.

Figure 4:
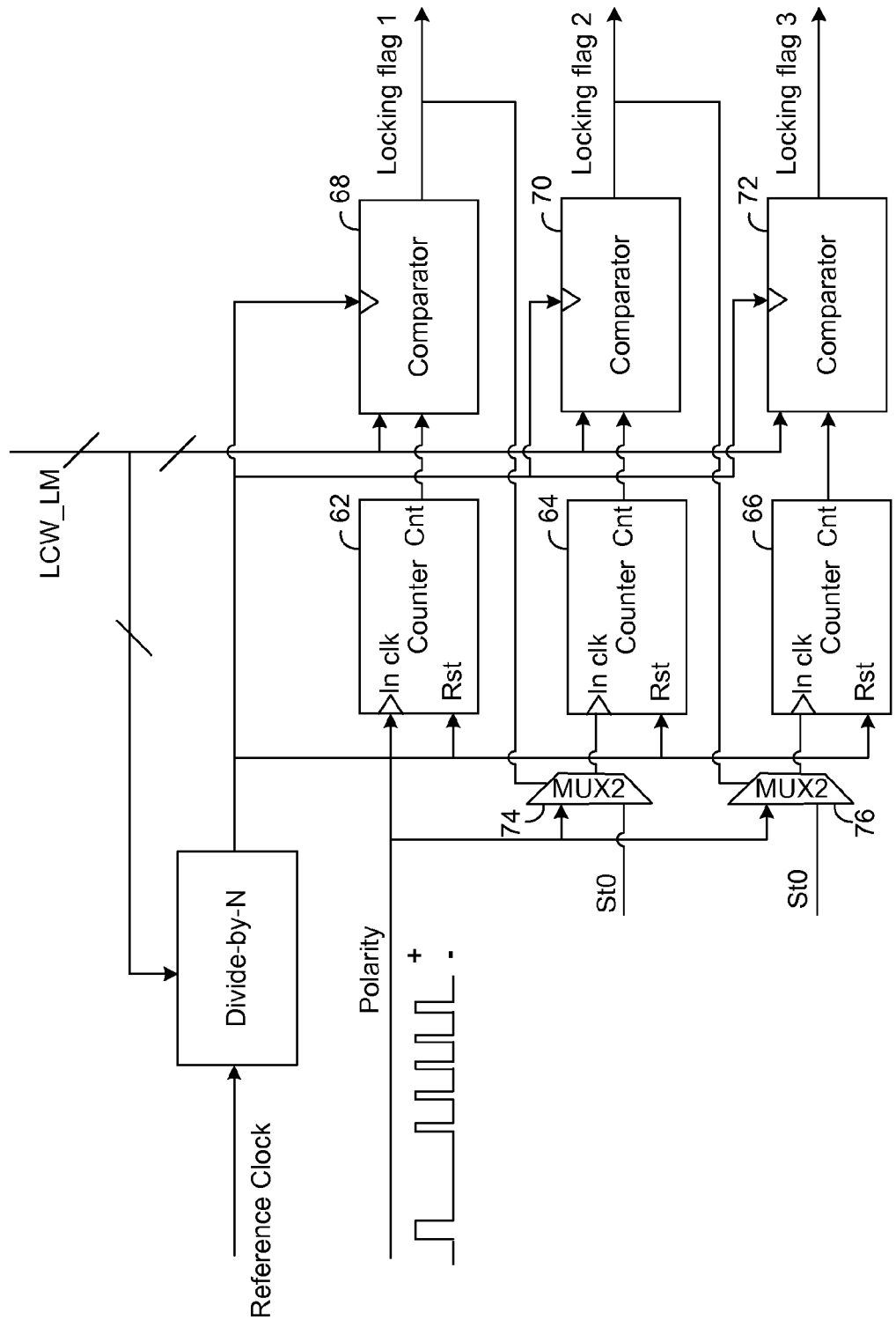
FIG. 4 illustrates a block diagram for a locking monitor of an ADPLL of the present invention.

FIG. 4 illustrates a block diagram of a locking monitor for an ADPLL of the present invention. The locking monitor comprises multiple cyclic reset counters 62, 64, and 66 and threshold comparators 68, 70, and 72, where multiplexers 74 and 76 connect comparators 68, 70, and 72 and counters 62, 64, and 66 to generate locking flags. Each comparator can have a threshold value to compare against the number of polarity transitions in a predefined amount of time.

If a first threshold value for comparator 68 is met, then a locking flag 1 is generated. Also, the next cyclic reset counter and comparator are engaged. In particular, cyclic reset counter 64 and comparator 70 are engaged. If a second threshold value for comparator 70 is met, then a locking flag 2 is generated, and so on so forth. Thus, when a threshold value is met, then the ADPLL adaptively switches to the next locking mode. The threshold value for each comparator can be adjusted and programmable. Additionally, a predefined monitor time for each counter can also be adjusted and programmable.

The LCW_LM control signal controls the monitor time and the threshold value for the locking detector. If the number of polarity changes at the DPFD exceeds the threshold value in one cycle of the monitor time, the locking flag is generated. When a locking flag is generated, then a next locking flag can be enabled.

Figure 5:
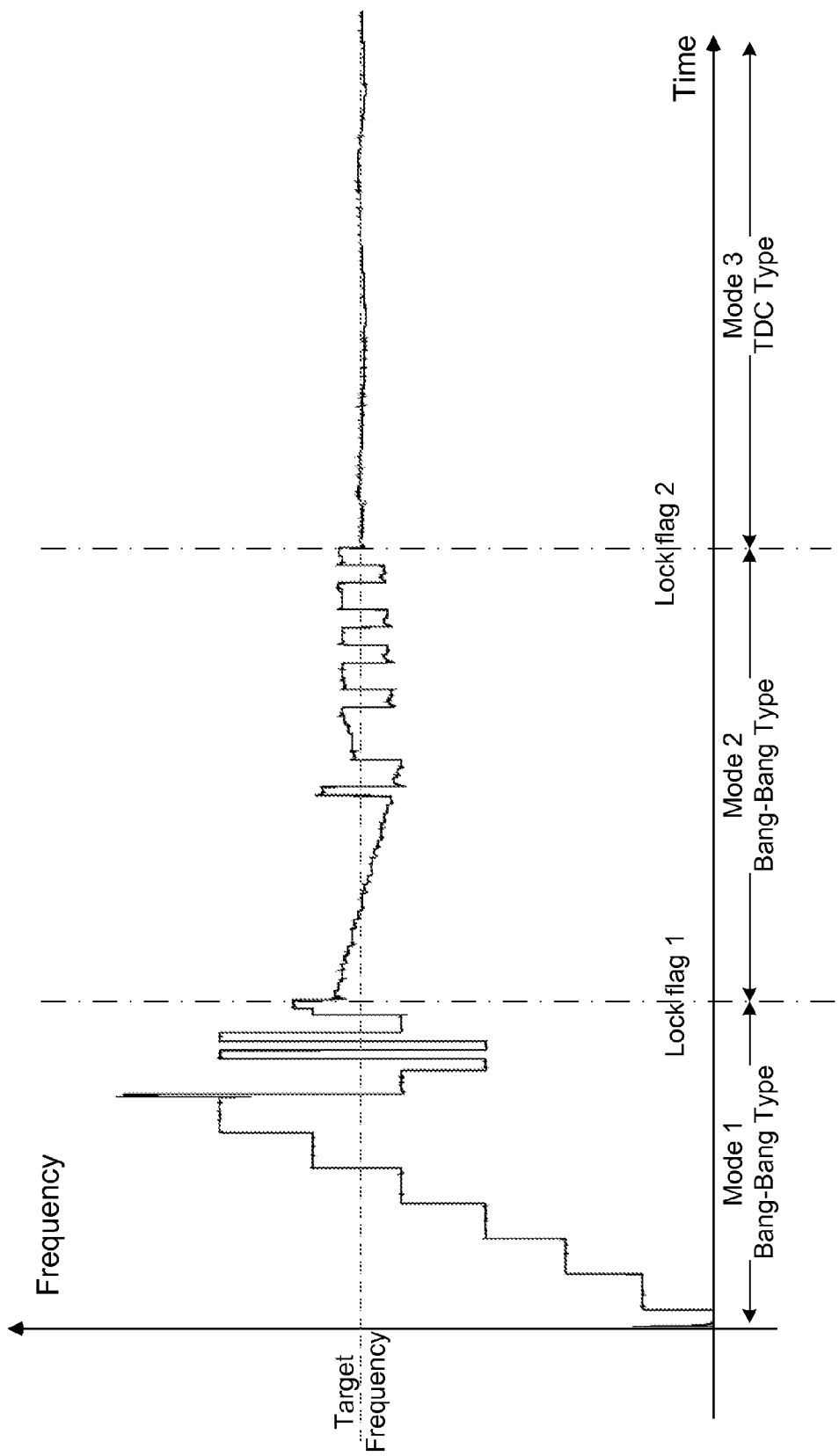
FIG. 5 illustrates a graphical representation for a locking process of an ADPLL of the present invention.

FIG. 5 illustrates a graphical representation of a locking process of an ADPLL of the present invention. In an example of the locking process, a locking mode 1 using a B-B configuration type for the ADPLL can be initiated. Once the locking flag 1 is generated, the next locking mode, locking mode 2, can be initiated, having a B-B configuration type. When the next locking flag, i.e., locking flag 2, is generated, a locking mode using a TDC configuration type can be initiated. In this example, the locking mode increases from locking mode 1 to locking mode 2, and so forth and so on, as the respective locking flags are triggered. It is understood that that a next locking mode can be set in any order, such as in sequential order as stated in the example above or in any other order, including locking mode 1, locking mode 3 and then locking mode 2.

Figure 6:
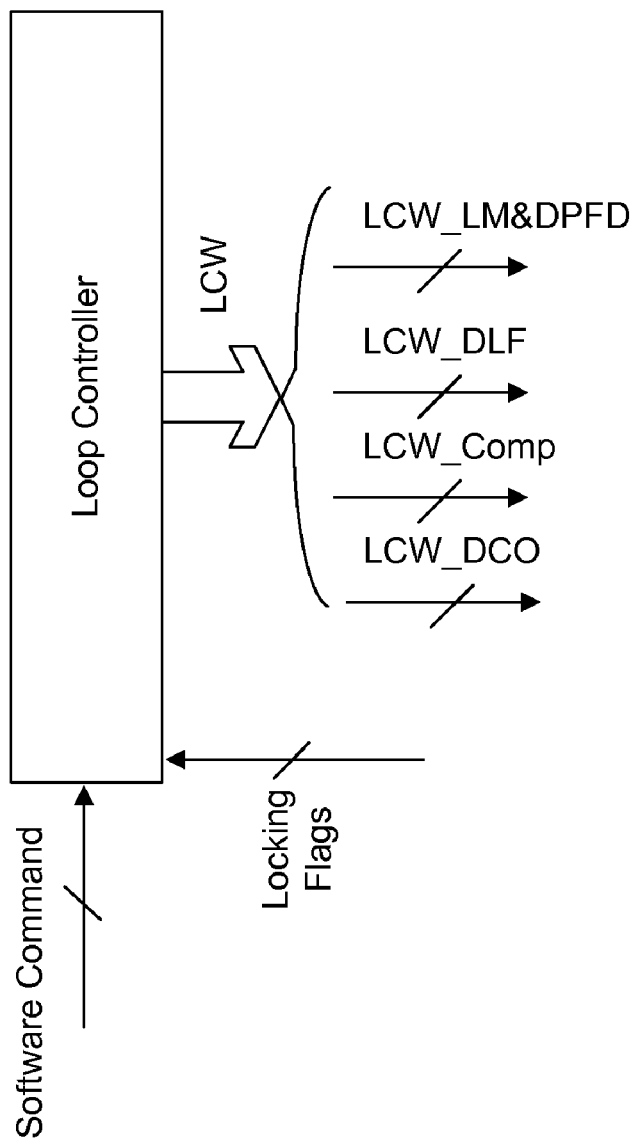
FIG. 6 illustrates a loop controller flow diagram for configuring an ADPLL of the present invention.

FIG. 6 illustrates a loop controller flow diagram for configuring an ADPLL of the present invention. According to the user pre-defined software commands, the loop controller can generate a loop control word to configure the ADPLL system according to a locking mode. The loop controller controls the various components in the ADPLL via the loop control word. The locking monitor combined with the loop controller can serve as an adaptive control method for switching the locking modes of the ADPLL of the present invention.

The Saturation Transferred Digital Phase Frequency Detector

Figure 7:
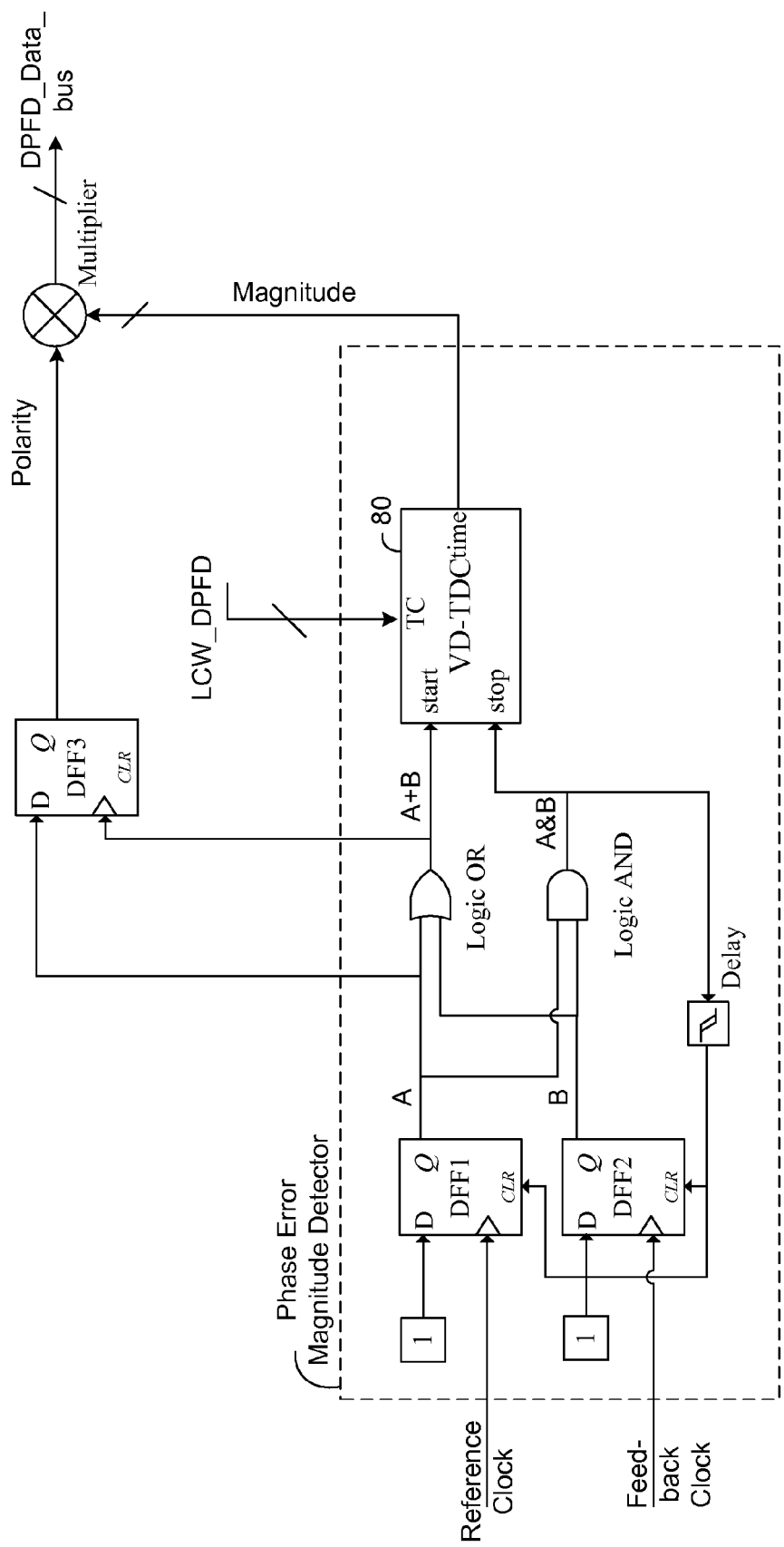
FIG. 7 illustrates a schematic for a saturation transferred digital phase/frequency detector of an ADPLL of the present invention.

FIG. 7 illustrates a saturation transferred digital phase/frequency detector of an ADPLL of the present invention. The saturation transferred digital phase/frequency detector ("ST-DPFD") can be a dual-mode device (or multi-mode device). An example of a ST-DPFD in the US non-provisional patent application entitled "A Digital Phase and Frequency Detector" filed on Jul. 13, 2010 and having an application Ser. No. 12/835,689 is incorporated herein by reference.

According to the loop control word, LCW_DPFD, the ST-DPFD can operate using one of the locking modes and using one of the operating levels. Thus, the output signal of the DPFD, a DPFD_Data_bus signal, can be a B-B based detection signal, which contains the polarity information of the input phase difference, or a TDC based detection signal, which contains the polarity and magnitude information of the input phase error.

Figure 8:
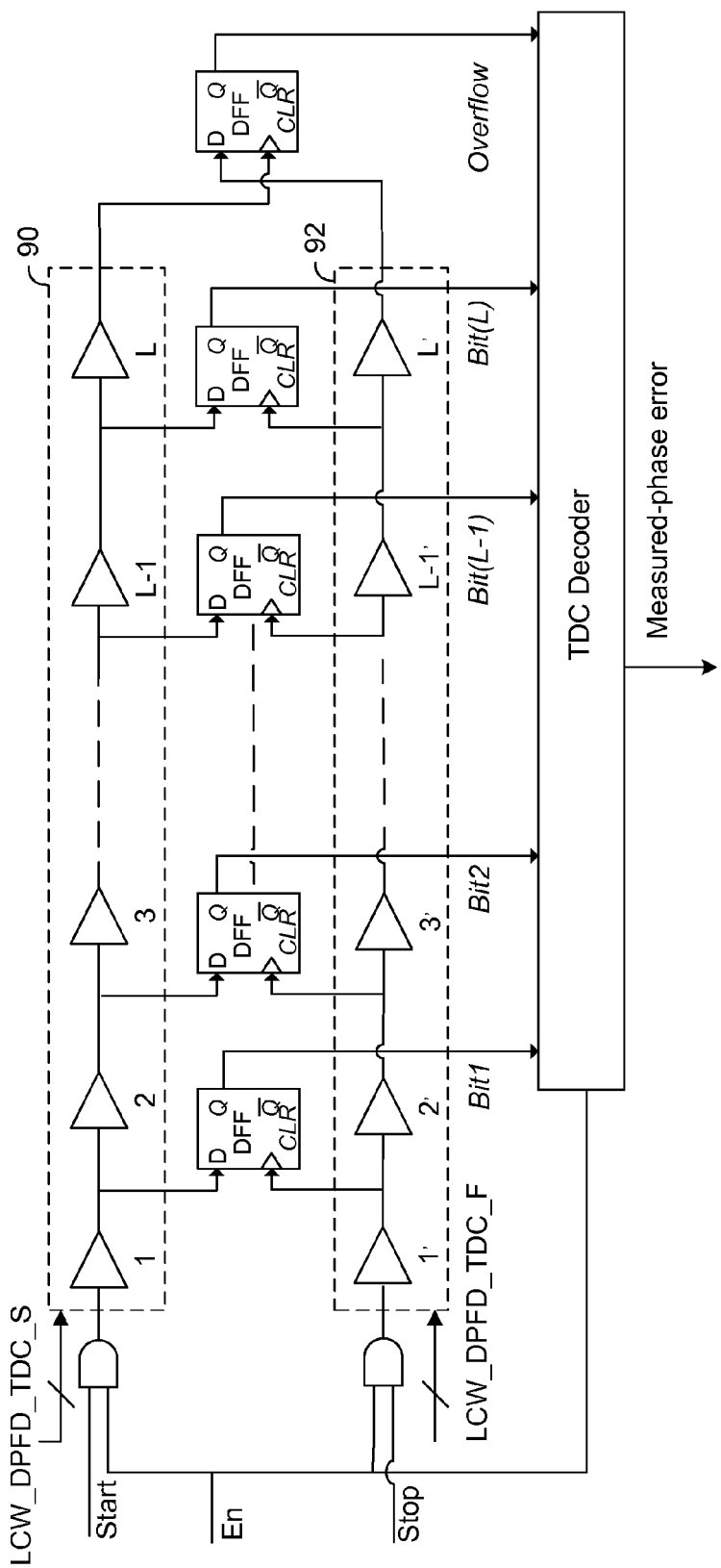
FIG. 8 illustrates a schematic for a VD-TDC of the present invention.

Under a TDC based locking mode, the magnitude information of the phase error is quantized by a Vernier-Delay line TDC ("VD-TDC") 80. FIG. 8 illustrates the circuit blocks in the VD-TDC 80, which handle the linear based locking mode of the VD-TDC 80. The VD-TDC 80 contains a slow buffer chain 90 and a fast buffer chain 92, each of the buffer chains has L buffers. The delay of a single buffer of the slow buffer chain is T1 where the single buffer counterpart in the fast buffer chain is T2. Generally, T1 is larger than T2 to guarantee a proper operation of the VD-TDC 80.

The resolution of the VD-TDC 80 is determined by the difference between T1 and T2. The non-saturation range of the VD-TDC 80 depends both on the T1 and T2 difference, and the number of the delay stages in a chain. Each buffer of the VD-TDC 80 is realized by a digitally controlled manner.

A LCW_DPFD_TDC_S command signal can be used to configure the parameters for the buffer (e.g., the buffer delay times, T1 and T2).

Figure 9:
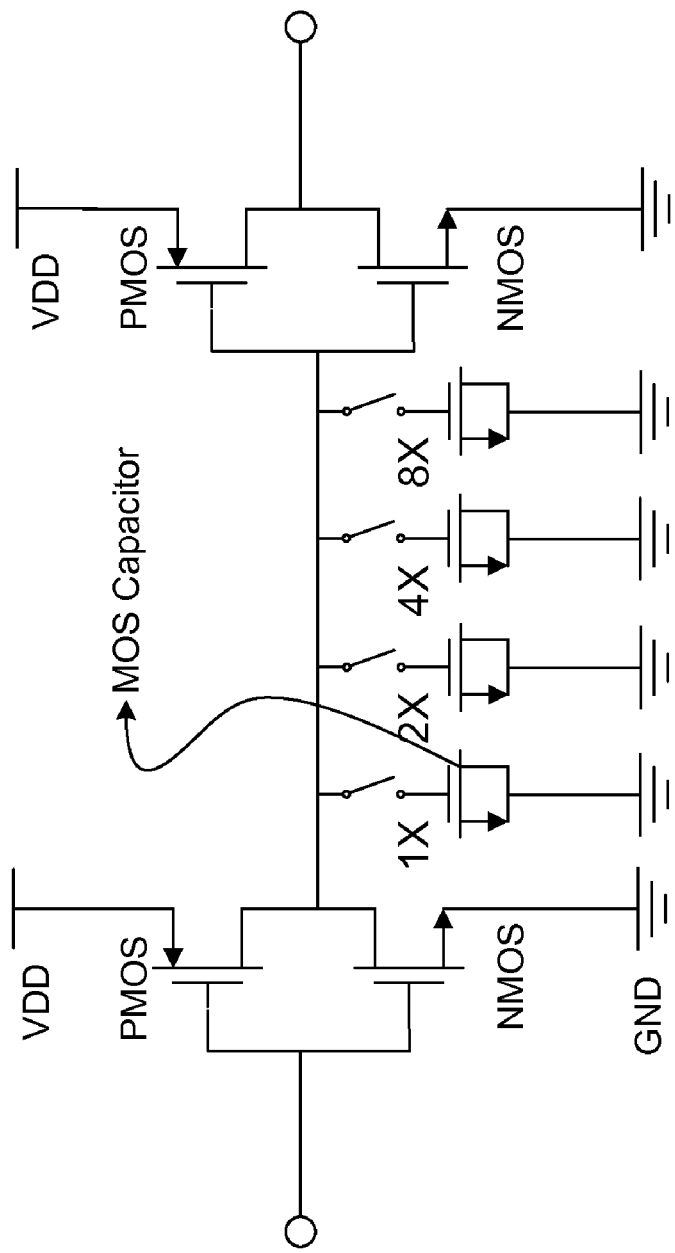
FIG. 9 illustrates a circuit diagram for a buffer of a VD-TDC.

FIG. 9 illustrates an example of a buffer of the VD-TDC 80. The capacitor load between stage 1 and stage 2 of the respective buffer is controlled by the MOS switches. When the digital control word for these switches change, the capacitor load is changed, affecting the delay time of the respective buffer.

Figure 10:
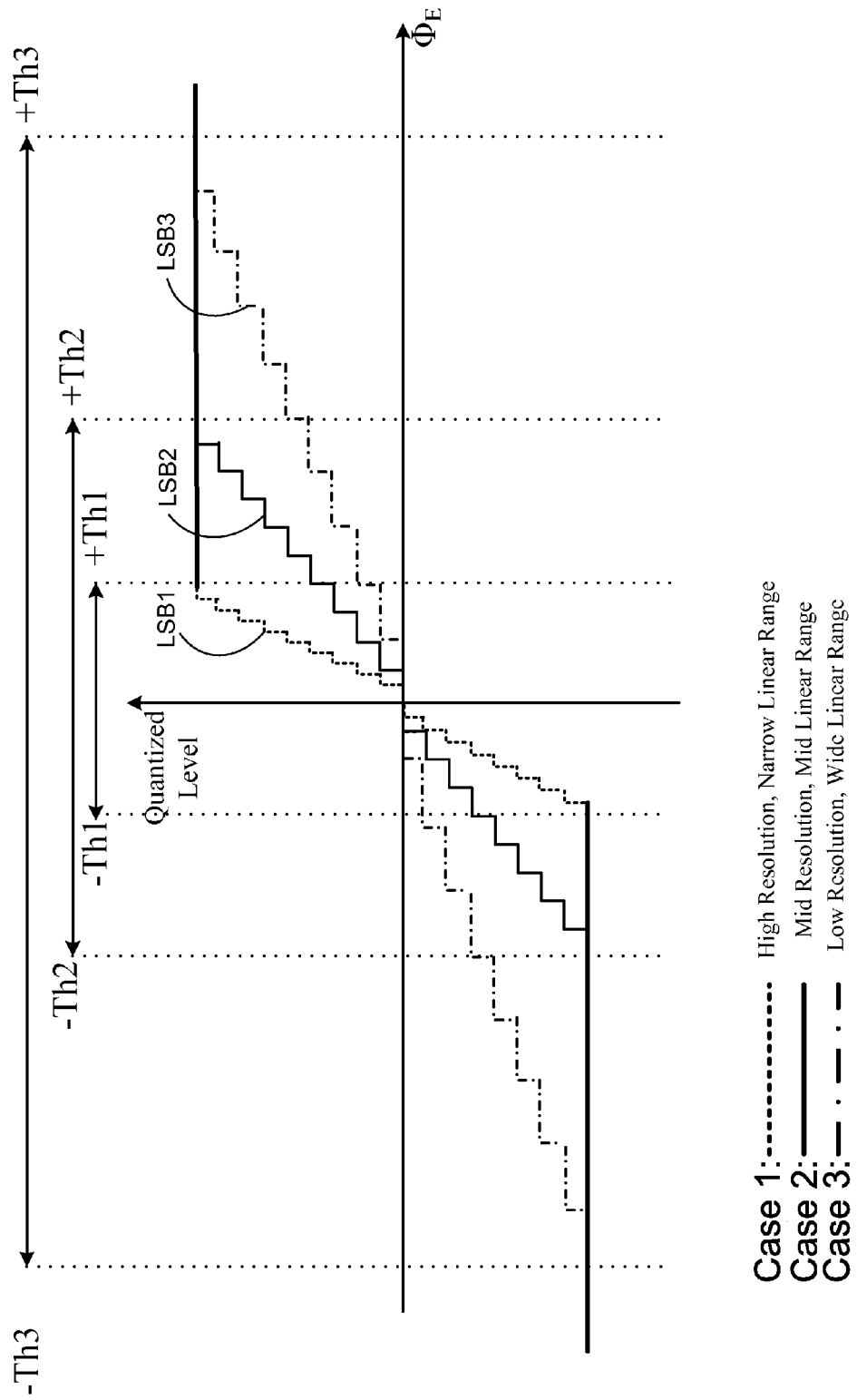
FIG. 10 illustrates a graph of various transfer curves for a DPFD of an ADPLL of the present invention.

FIG. 10 illustrates a transfer curve of the DPFD for various resolutions. Using the digitally controlled buffers, the characteristics of the ST-DPFD can be configured by the loop control word LCW_DPFD_S and LCW_DPFD_F. The linear regions of the DPFD are denoted by ±Th1, ±Th2, and ±Th3. The resolutions are denoted by LSB1, LSB2, and LSB3. The resolution can be from the highest, LSB1 line, to the lowest resolution, LSB3 line. The resolution is selected according to the current locking mode of the DPLL.

The Multi-Mode Digital Loop Filter

Figure 11:
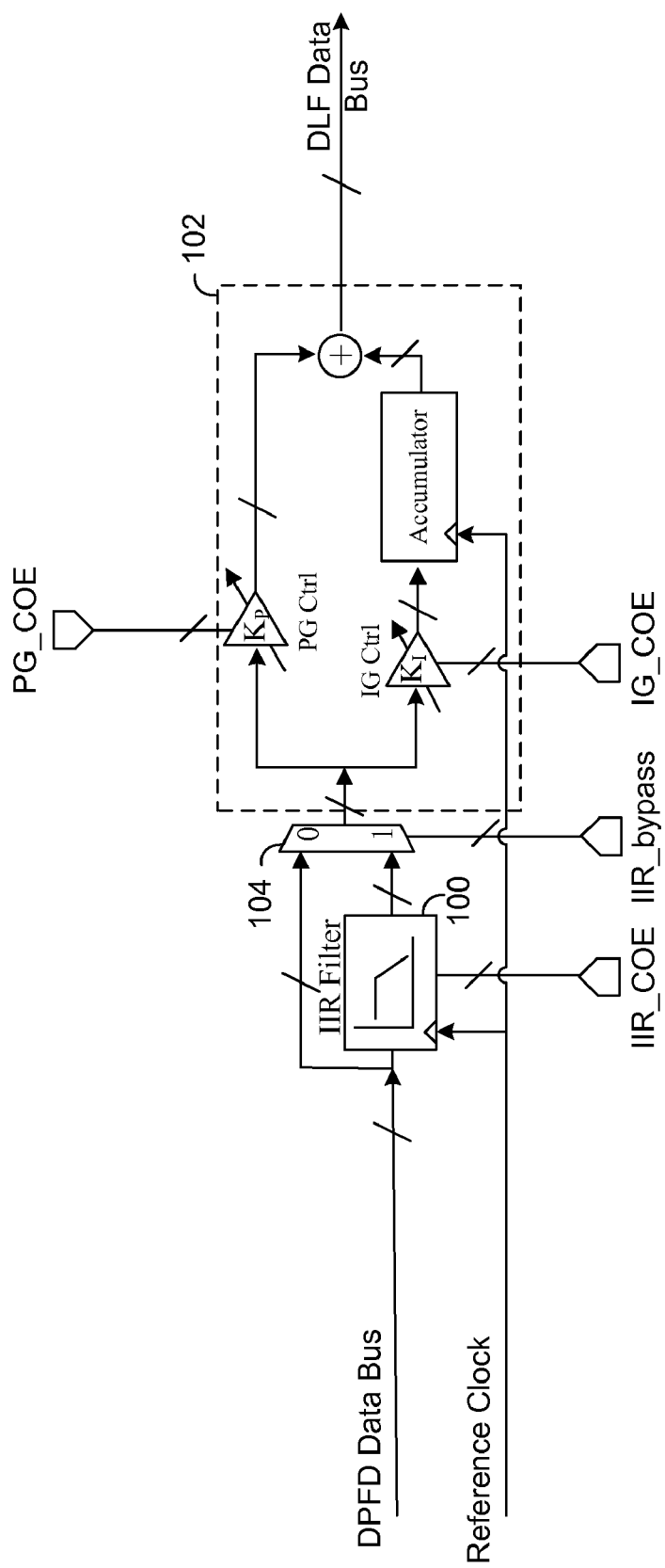
FIG. 11 illustrates a block diagram for a DLF of the present invention, where the DLF comprises an IIR low pass filter, a PI controller, and an IIR bypass MUX.

The multi-mode digital loop filter ("MM-DLF") can be digitally configured by the loop control word LCW_DLF to adapt to each of the locking modes of the ADPLL. FIG. 11 illustrates a MM-DLF of the present invention, where the MM-DLF comprises an IIR low pass filter 100, a PI controller 102, and an IIR bypass MUX 104.

When the ADPLL is operated under a locking mode using a B-B locking method, the IIR filter 100 of the MM_DLF can be bypassed. The parameters $K_P$ and $K_I$ of the digital PI controller 102 can be adjusted by the LCW_DLF to assure that the behavioral trajectory of the system to be convergence.

When the ADPLL is operated under a locking mode using a TDC based locking method, the IIR filter 100 is connected to the MUX 104. The coefficient of the IIR filter and parameters $K_P$ and $K_I$ of the digital PI controller 102 can also be adjusted by the LCW_DLF to meet the stability and bandwidth requirements of the system.

The Digitally Controlled Oscillator

Figure 12:
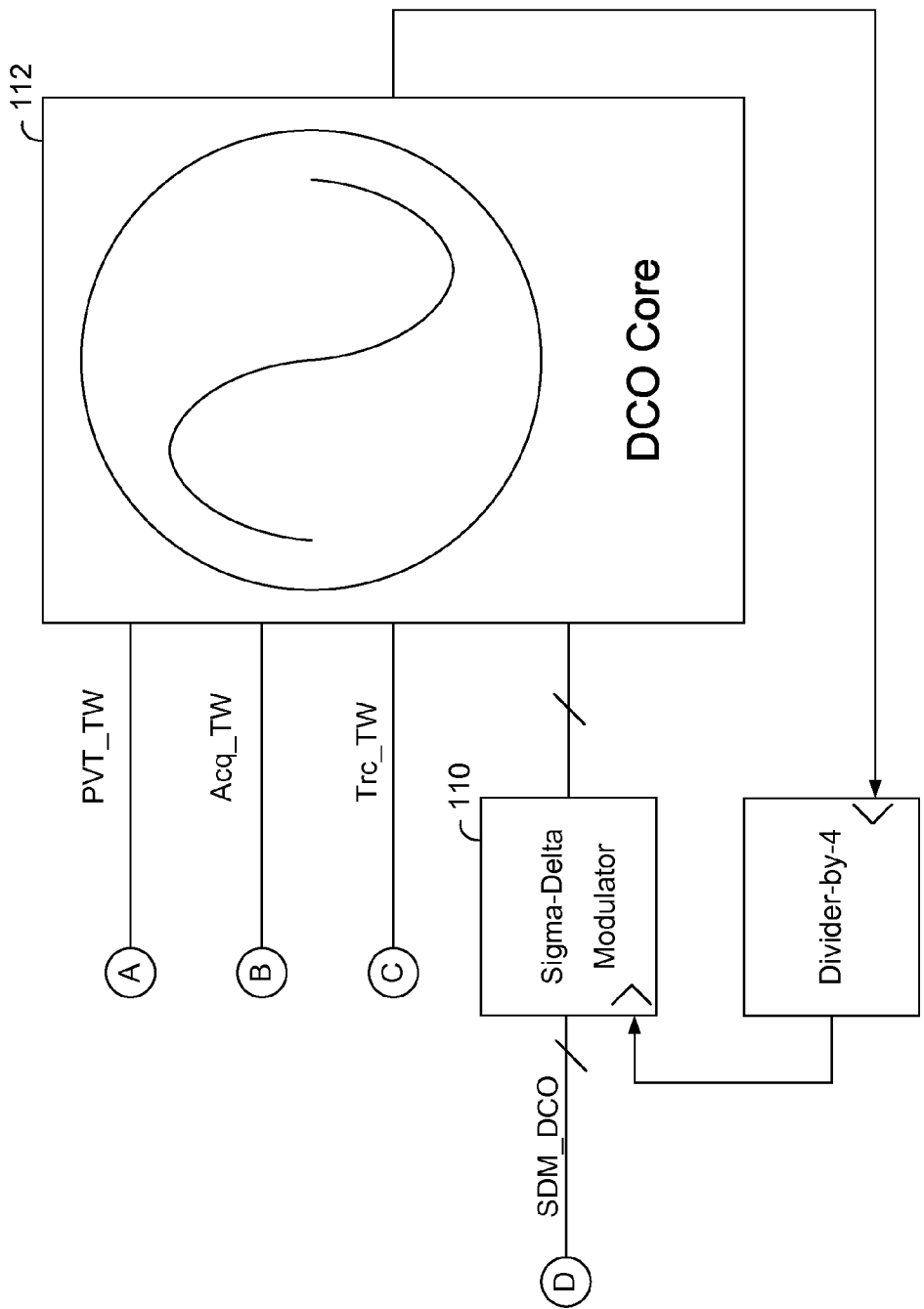
FIG. 12 illustrates a circuit diagram for a wide-band DCO of the present invention.

FIG. 12 illustrates a commonly used wide-band digital controlled oscillator ("DCO"). For a covered frequency range and a tuning resolution, a DCO core 112 is designed to have several control banks Limited by semiconductor physics, the frequency tuning resolution is hardly better than 20 kHz/LSB. To enhance the resolution, a sigma-delta modulator 110 is placed in front of the finest frequency tuning bank. An example of the frequency plan of the DCO is illustrated in Table 1.

TABLE 1

An example of the DCO frequency plan

| Bank | Weighted | Resolution | Frequency range |
|---|---|---|---|
| PVT Bank | 6 bits binary | 20M | 1280M |
| ACQ Bank | 6 bits binary | 800k | 51.2M |
| Tracking bank | 64 bits Unit | 40k | 2.56M |
| Tracking bank (dither) | 2 bits Unit | 40k | 40K |

Figure 13:
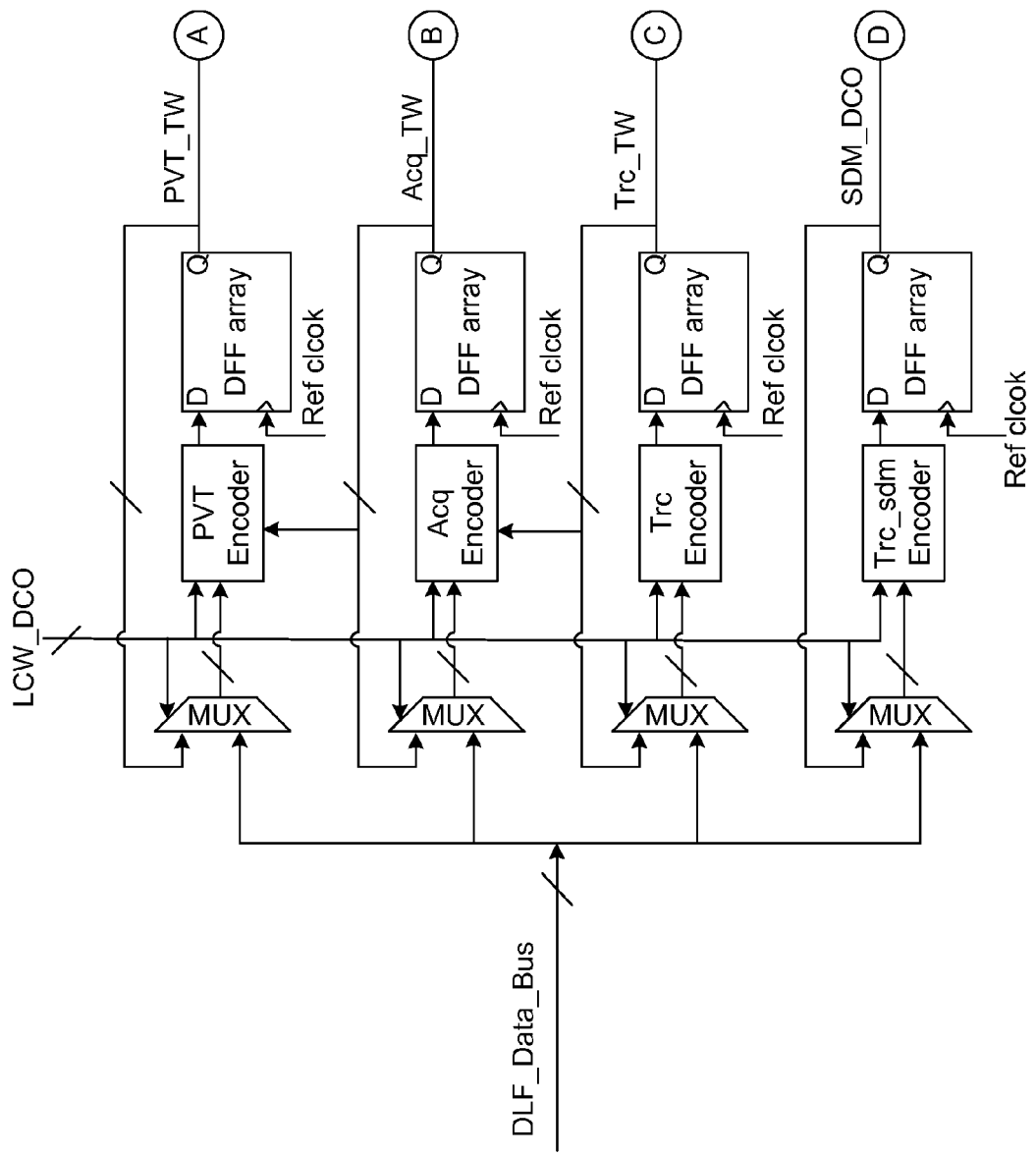
FIG. 13 illustrates a block diagram for a DCO encoder of the present invention.

FIG. 13 illustrates a DCO encoder of the present invention. During the locking process, the DCO is tuned from PVT bank to Trc bank by the loop. A DCO encoder is placed between the MM-DLF and the DCO to convert the DLF control data to a DCO tuning word. According to the loop control word LCW_DCO, each tuning word can be a hold or writable command. An example of the DCO encoder's operation method is illustrated by table 2.

The DCO can be automatically adjusted to overcome various variables in the system, such as the process, temperature, and voltage variation. For instance, under the hold situation, if the tuning word from the next bank exceed an upper or lower limit, the PVT_TW and Acq_TW will be add or subtract a LSB to push the tuning word to a proper one.

With the help of the DCO encoder, the proposed ADPLL can eliminate the use of automatic frequency control ("AFC") circuits to achieve a wide band frequency tuning.

TABLE 2

An example of the DCO encoder operation method

| LCW_DCO | PVT_TW | Acq_TW | Trc_TW | SDM_DCO |
|---|---|---|---|---|
| b'000 | writable | hold | hold | hold |
| b'001 | hold | writable | hold | hold |
| b'011 | hold | hold | writable | hold |
| b'111 | hold | hold | writable | writable |

The tuning words of the DCO banks can be generated by the digital loop filter. At different locking modes, the digital loop filter tunes different banks, i.e., writable banks and the tuning word for the other banks are on hold.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A phase locked loop ("PLL"), comprising:
    a digital phase detector ("DPD") for receiving a reference signal and a feedback signal and for generating a detection signal indicative of a phase difference between the reference signal and the feedback signal and is a function of a selected locking mode;
    a locking monitor for monitoring polarity transitions of the detection signal, wherein the selected locking mode is selected from a plurality of locking modes as a function of the monitored polarity transitions; and
    an oscillator for generating the feedback signal as a function of the detection signal.

2. The PLL of claim 1 wherein the plurality of locking modes comprises a nonlinear based configuration type and a linear based configuration type.

3. The PLL of claim 1 further comprising a digital loop filter for filtering the detection signal, wherein parameters of the digital loop filter are adjusted according to the selected locking mode.

4. The PLL of claim 1 wherein a resolution of the DPD is adjustable according to the selected locking mode.

5. The PLL of claim 1 wherein the oscillator is configured according to the selected locking mode.

6. The PLL of claim 1 wherein the locking monitor generates a locking flag to indicate when the monitored polarity changes have reached a threshold value.

7. The PLL of claim 6 wherein the locking flag indicates that a next locking mode is to be selected.

8. The PLL of claim 6 wherein the locking monitor comprises a cyclic reset counter and a comparator, wherein the cyclic reset counter tracks the number of polarity transitions of the detection signal during a predefined amount of time, and wherein the comparator generates the locking flag.

9. The PLL of claim 8 wherein the locking monitor further comprises one or more comparators and wherein each of the comparators generate a locking flag indicative of one of the plurality of locking modes.

10. The PLL of claim 1 wherein the detection signal is indicative of a frequency difference between the reference signal and the feedback signal.

11. The PLL of claim 1 further comprising an encoder, wherein the encoder converts the detection signal to an oscillator tuning word for controlling the oscillator.

12. A phase locked loop ("PLL"), comprising:
a digital phase detector ("DPD") for receiving a reference signal and a feedback signal and for generating a detection signal indicative of a phase difference between the reference signal and the feedback signal and is a function of a selected locking mode, wherein a resolution of the DPD is adjustable according to the selected locking mode;
a locking monitor for monitoring polarity transitions of the detection signal, wherein the selected locking mode is selected from a plurality of locking modes as a function of the monitored polarity transitions and wherein the plurality of locking modes comprises a nonlinear based configuration type and a linear based configuration type; and
an oscillator for generating the feedback signal as a function of the detection signal.

13. The PLL of claim 12 further comprising a digital loop filter for filtering the detection signal, wherein parameters of the digital loop filter are adjusted according to the selected locking mode.

14. The PLL of claim 12 wherein the oscillator is configured according to the selected locking mode.

15. The PLL of claim 12 wherein the locking monitor generates a locking flag to indicate when the monitored polarity changes have reached a threshold value.

16. The PLL of claim 15 wherein the locking flag indicates that a next locking mode is to be selected.

17. The PLL of claim 15 wherein the locking monitor comprises a cyclic reset counter and a comparator, wherein the cyclic reset counter tracks the number of polarity transitions of the detection signal during a predefined amount of time, and wherein the comparator generates the locking flag.

18. The PLL of claim 17 wherein the locking monitor further comprises one or more comparators and wherein each of the comparators generate a locking flag indicative of one of the plurality of locking modes.

19. The PLL of claim 12 wherein the detection signal is indicative of a frequency difference between the reference signal and the feedback signal.

20. A phase locked loop ("PLL"), comprising:
a digital phase and frequency detector ("DPFD") for receiving a reference signal and a feedback signal and for generating a detection signal indicative of a phase difference and a frequency difference between the reference signal and the feedback signal and is a function of a selected locking mode, wherein a resolution of the DPFD is adjustable according to the selected locking mode;
a locking monitor for monitoring polarity transitions of the detection signal, comprising one or more comparators, wherein the selected locking mode is selected from a plurality of locking modes as a function of the monitored polarity transitions, wherein the plurality of locking modes comprises a nonlinear based locking mode and a linear based locking mode, wherein each of the comparators generate a locking flag to indicate when the monitored polarity changes have reached a threshold value, and wherein the locking flag indicates that a next locking mode is to be selected;
a digital loop filter for filtering the detection signal, wherein a filtering bandwidth of the digital loop filter is adjusted according to the selected locking mode;
an encoder, wherein the encoder converts the filtered detection signal to an oscillator tuning word; and
an oscillator for generating the feedback signal as a function of the filtered detection signal, wherein the oscillator is configured according to the selected locking mode and controlled by the oscillator tuning word.

* * * * *